(12) United States Patent　　　(10) Patent No.:　US 12,656,688 B2
Kemp et al.　　　　　　　　　　　(45) Date of Patent:　　Jun. 16, 2026

(54) LOW OXYGEN SCANNING UV SOURCE WITH LOCALIZED PURGE

(71) Applicant: Applied Materials, Inc., Santa Clara, CA (US)

(72) Inventors: Michael David-Scott Kemp, San Jose, CA (US); Daihua Zhang, Los Altos, CA (US); Ludovic Godet, Sunnyvale, CA (US); Mahendran Chidambaram, Saratoga, CA (US); Sumedh Dattatraya Acharya, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 582 days.

(21) Appl. No.: 18/085,649

(22) Filed: Dec. 21, 2022

(65) Prior Publication Data

US 2023/0229086 A1　　Jul. 20, 2023

(30) Foreign Application Priority Data

Jan. 20, 2022　　(IN) ............................. 202241003329

(51) Int. Cl.
　　*G03F 7/20*　　　(2006.01)
　　*B41M 7/00*　　　(2006.01)
(52) U.S. Cl.
　　CPC ......... *G03F 7/2002* (2013.01); *B41M 7/0081* (2013.01)
(58) Field of Classification Search
　　CPC ........ G03F 7/2002; G03F 7/38; B41M 7/0081
　　See application file for complete search history.

(56) References Cited

U.S. PATENT DOCUMENTS

| | | | | |
|---|---|---|---|---|
| 4,434,562 A | * | 3/1984 | Bubley ............... | B41F 23/0409 |
| | | | | 422/186 |
| 8,298,458 B2 | * | 10/2012 | Rogers ............. | B29D 11/00134 |
| | | | | 264/494 |
| 2012/0132618 A1 | * | 5/2012 | Baluja ..................... | G02B 5/22 |
| | | | | 118/723 R |

(Continued)

FOREIGN PATENT DOCUMENTS

| | | | | |
|---|---|---|---|---|
| DE | 102015226316 B3 | * | 4/2017 | |
| WO | WO-2007001281 A1 | * | 1/2007 | ........ H01L 21/67115 |

OTHER PUBLICATIONS

International Search Report and Written Opinion for International Application No. PCT/US2022/053581 dated May 3, 2023.

*Primary Examiner* — David E Smith
(74) *Attorney, Agent, or Firm* — Patterson + Sheridan, LLP

(57)　　　　　　　ABSTRACT

A method and apparatus for curing a substrate are described. The apparatus includes a curing apparatus with a casing and an ultraviolet (UV) radiation assembly coupled to the casing. The ultraviolet radiation assembly further includes a line UV radiation source. The casing includes an opening on one end. A substrate passes by the opening and is exposed to the UV radiation of the line UV radiation source. The curing apparatus further includes a purge assembly configured to continuously purge the process volume and the volume directly above the exposed portion of the substrate. The curing apparatus is configured to only cure a portion of the substrate at any one point in time, such that the curing apparatus is a scanning curing apparatus and includes a small process volume.

20 Claims, 4 Drawing Sheets

(56)        References Cited

U.S. PATENT DOCUMENTS

| 2013/0160946 A1* | 6/2013 | Smargiassi ........ | H01L 21/02348 |
| | | | 156/345.5 |
| 2014/0099798 A1* | 4/2014 | Tsuji ................... | H01L 21/2686 |
| | | | 438/795 |
| 2014/0220489 A1 | 8/2014 | Kozuma et al. | |
| 2015/0132973 A1* | 5/2015 | Hung ................ | H01L 21/67115 |
| | | | 438/795 |
| 2015/0371894 A1* | 12/2015 | Kaneda ............. | H01L 21/67109 |
| | | | 156/345.52 |

* cited by examiner

LOW OXYGEN SCANNING UV SOURCE WITH LOCALIZED PURGE

CROSS-REFERENCE TO RELATED APPLICATIONS

This application claims benefit of India Provisional Application No. 202241003329, filed Jan. 20, 2022, which is herein incorporated by reference in its entirety.

BACKGROUND

Field

Embodiments of the present disclosure generally relate to apparatus and methods of curing a substrate. More specifically, embodiments of the present disclosure relate to apparatus for curing a layer of a semiconductor substrate.

Description of the Related Art

During semiconductor and optical device processing, curing operations are utilized periodically to, among other things, remove solvent from a layer, harden a layer, or change the characteristics of a layer. Curing a substrate includes exposing the substrate to radiation, such as ultraviolet (UV) radiation, until the substrate has achieved a targeted property. Curing is performed at a variety of temperatures and pressures.

In some curing operations, a resist material is baked before or after patterning to set the exposure pattern. The baking of the resist material may further assist in cross-linking of portions of the resist layer.

Substrates are generally cured using an area-type exposure. The area-type exposure positions the substrate in a bake or a cure chamber and exposes an entirety of the substrate simultaneously. The bake and/or cure chamber has a large volume and utilizes a large quantity of purge gas during the bake and/or cure operation. The area-type exposure also suffers from poor cure uniformity as the radiation exposure of the substrate is non-uniform.

Therefore, what is needed are improved apparatus and methods of curing substrates.

SUMMARY

The present disclosure generally relates to apparatus for curing a substrate, suitable for use during semiconductor manufacturing. The apparatus includes a casing comprising a top surface and a bottom surface. A first opening is disposed through the top surface and a second opening is disposed through the bottom surface. An ultraviolet (UV) radiation assembly is disposed through the first opening and includes a line UV radiation source. The line UV radiation source is disposed within a volume between the top surface and the bottom surface. A purge gas inlet is disposed through a wall of the casing.

In another embodiment, another apparatus for curing a substrate is provided. The apparatus includes a casing defining a volume. A UV radiation assembly is disposed through a first opening through a top surface of the casing and includes a line UV radiation source. The line UV radiation source is disposed within the volume. A purge gas inlet is disposed through a first sidewall of the casing and in fluid communication with the volume.

In yet another embodiment, another apparatus for curing a substrate is provided. The apparatus includes a transfer chamber, one or more processing chambers coupled to the transfer chamber, and a UV curing system. The UV curing system includes a casing forming a volume. A UV radiation assembly is disposed through a first opening through a top surface of the casing and includes a line UV radiation source. The line UV radiation source is disposed within the volume. A purge gas inlet is disposed through a first sidewall of the casing and in fluid communication with the volume.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure is directed towards a curing apparatus for curing a substrate. More specifically, the present disclosure is directed towards a line UV curing apparatus for curing a substrate. The line UV curing apparatus is configured to have a substrate pass underneath a line UV source. The line UV source is a UV source which is extended over a length of at least a portion of the substrate. In some embodiments, the line UV source extends over an entire diameter of a substrate. The line UV curing apparatus only exposes a small portion of the area of the substrate at once. The area of the substrate exposed is a line across the substrate, such that the entire area of the substrate passes underneath the line UV source of the line UV curing apparatus to cure the substrate.

The line UV curing apparatus is compact and may be integrated within a processing chamber and/or a transfer chamber. In some embodiments, the line UV curing apparatus is disposed between two chambers, such that as the substrate is passed from a first chamber to a second chamber, the substrate passes beneath the line UV source and is cured. The compact nature of the line UV curing apparatus provides process and assembly flexibility.

The small size of the UV curing volume further enables the amount of purge gas utilized to be reduced. As the UV curing volume is smaller, less volume is being purged during the curing operations. The reduced purge gas usage reduces cost of ownership and may reduce the size of gas panels associated with the curing system. In some embodiments, the purge gas utilized is a nitrogen ($N_2$) purge gas.

The line UV source and exposure of the substrate as a line exposure further enables a higher UV output per area to the substrate. Higher UV output per area enables a faster UV cure of the substrate. The line UV curing apparatus may further utilize an air-cooling system to remove difficulties associated with liquid cooling UV sources.

The line UV curing apparatus includes a purge assembly which is configured to provide a purge flow over the portion of the substrate being exposed by the line UV source. The purge gas is introduced into the curing volume through a diffusion member. The diffusion member filters particles in the purge gas line and diffuses the purge gas before the purge gas is introduced into the curing volume.

Figure 1:
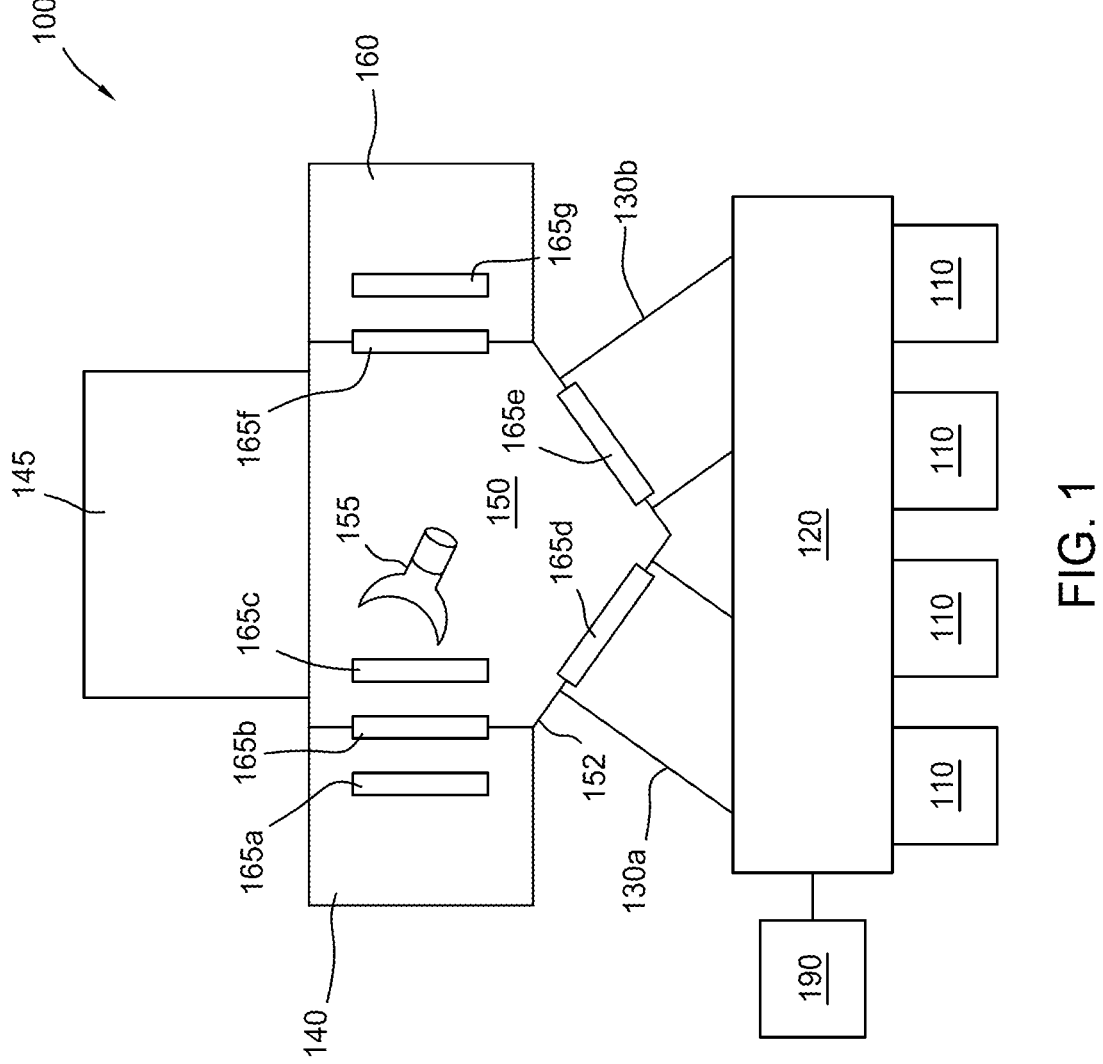
FIG. 1 illustrates a schematic plan view of a processing assembly for processing a substrate, according to embodiments described herein.

FIG. 1 illustrates a schematic plan view of a processing assembly 100 for processing a substrate. The processing assembly 100 includes one or more load lock chambers 130a, 130b, a transfer chamber 150, a plurality of processing chambers 140, 145, 160, a front end factory interface (FI) 120, and a plurality of front opening unified pods (FOUPs) 110. The load lock chambers 130a, 130b are coupled to an outer surface 152 of the transfer chamber 150. The plurality of processing chambers 140, 145, 160 are further coupled to the outer surface 152 of the transfer chamber 150. In the embodiment of FIG. 1, there are two load lock chambers 130a, 130b and three processing chambers 140, 145, 160. The load lock chambers 130a, 130b are disposed between the transfer chamber 150 and a front end factory interface "FI" 120. A substrate is passed through the load lock chambers 130a, 130b when being transferred from the front end FI 120 to the transfer chamber 150 and from the transfer chamber 150 to the front end FI 120. The load lock chambers 130a, 130b connect to a vacuum pump (not shown), for example a roughing pump, the output of which is connected to an exhaust duct (not shown), to reduce the pressure within the load lock chambers 130a, 130b to a sub-atmospheric pressure on the order of about 10-3 Torr. The load lock chambers 130a, 130b may be connected to a vacuum pump dedicated thereto, or a vacuum pump shared with one or more components within the processing assembly 100, or to a house exhaust other than a vacuum pump to reduce the pressure therein. In each case, valves are disposed on either end of each of the load lock chambers 130a, 130b.

A first valve is disposed between each of the load lock chambers 130a, 130b and the front end FI 120. A second valve is disposed between each of the load lock chambers 130a, 130b and the transfer chamber 150. The first valve enables a seal to be formed between the front end FI 120 and the load lock chambers 130a, 130b while the load lock chambers 130a, 130b are being de-pressurized. The first valve further prevents the transfer chamber 150 from being exposed to atmospheric or ambient pressure conditions while the second valve is open and a substrate is being transferred to the load lock chambers 130a, 130b from the transfer chamber 150 or from the transfer chamber 150 to the load lock chambers 130a, 130b. The second valve enables a seal to be formed between the transfer chamber 150 and the load lock chambers 130a, 130b while the load lock chambers 130a, 130b are pressurized or in fluid communication with the front end FI 120. The second valve prevents the transfer chamber 150 from being exposed to atmospheric or ambient pressure conditions while the first valve is open and a substrate is being transferred to the load lock chambers 130a, 130b from the front end FI 120 or from the front end FI 120 to the load lock chambers 130a, 130b.

The transfer chamber 150 is configured to transfer one or more substrates between each of the load lock chamber 130a, 130b, and the processing chambers 140, 145, 160. As shown herein, the transfer chamber 150 includes a plurality of sidewalls, such that the transfer chamber 150 may have four sidewalls, five sidewalls, six sidewalls, seven sidewalls, or eight sidewalls. The transfer chamber 150 may include a transfer robot 155 or a carousel (not shown) for moving a substrate therein. The transfer robot 155 or carousel has one or more blades for holding the substrate and is actuated around a central axis of the transfer chamber 150. A transfer volume within the transfer chamber 150 is held at a vacuum during substrate processing, such as on the order of about 10-3 Torr or less.

Each of the processing chambers 140, 145, 160 are coupled to the transfer chamber 150. While three processing chambers 140, 145, 160 are shown, more or less processing chambers are also contemplated. Each of the processing chambers 140, 145, 160 may be one of a deposition chamber, a lithography chamber, or a curing chamber. In some embodiments, the first processing chamber 140 is a deposition chamber, the second processing chamber 145 is a lithography chamber, and the third processing chamber 160 is a curing chamber. In some embodiments, the third processing chamber 160 is a second deposition chamber or a second lithography chamber.

The deposition chamber may be any suitable deposition chamber, such as an inkjet printing chamber or apparatus. The lithography chamber may be a suitable lithography processing chamber, such as a nanoimprint lithography chamber, an immersion lithography chamber, and/or an optical lithography chamber. The lithography chamber is configured to pattern a layer of a substrate. The curing chamber is configured to heat a substrate and/or expose the substrate to UV radiation to cure a layer of the substrate. In some embodiments, the curing chamber is integrated with the deposition chamber.

In some embodiments, the processing assembly 100 further includes one or more pre-clean module (not shown). The pre-clean modules may be coupled to the transfer chamber 150, the front end FI 120, and/or the load lock chambers 130a, 130b. Each of the pre-clean modules are configured to perform a pre-clean process on one or more substrates disposed therein. The pre-clean process may include a plasma etch process.

The location of one or more line UV curing apparatus 165a-165g is further illustrated in FIG. 1. The one or more line UV curing apparatus 165a-165g may be positioned in any of the locations illustrated in FIG. 1. The small size of the UV curing apparatus 165a-165g enables the UV curing apparatus 165a-165g to be positioned in various positions around the processing assembly 100. For example, the UV curing apparatus 165a-165g may be located within one or more of the processing chambers 140, 145, 160, such as the first processing chamber 140 and/or the third processing chamber 160. The UV curing apparatus 165a-165g may further be disposed between adjacent chambers, such as between the transfer chamber 150 and one of the processing chambers 140, 145, 160. The UV curing apparatus 165a-165g may also be disposed between the transfer chamber 150 and the load lock chambers 130a, 130b. Disposing the UV curing apparatus 165a-165g between two chambers enables a substrate to be cured as the substrate passes from a first chamber to a second chamber without utilizing additional apparatus or processing chambers.

In the embodiment of FIG. 1, a first UV curing apparatus 165a is disposed within the first processing chamber 140, a second UV curing apparatus 165b is disposed between the first processing chamber 140 and the transfer chamber 150, a third UV curing apparatus 165c is disposed within the transfer chamber 150, a fourth UV curing apparatus 165d is disposed between the first load lock chamber 130a and the transfer chamber 150, the fifth UV curing apparatus 165e is disposed between the second load lock chamber 130b and the transfer chamber 150, the sixth UV curing apparatus 165f is disposed between the transfer chamber 150 and the third processing chamber 160, and a seventh UV curing apparatus 165g is disposed within the third processing chamber 160.

A controller 190 is coupled to the processing assembly 100 and is configured to supply instructions to each of the front end FI 120, the transfer chamber 150, the load lock chambers 130a, 130b, and the processing chambers 140, 145, 160. The controller 190 further receives input from sensors within the processing assembly 100. For example, the controller 190 is configured to control a flow of various gases within the processing assembly and coordinate operation of power sources to facilitate substrate processing. The controller 190 may also be configured to control all aspects of heating within the processing assembly 100.

The controller 190 includes a programmable central processing unit (CPU) that is operable with a memory and a mass storage device, an input control unit, and a display unit (not shown), such as power supplies, clocks, cache, input/output (I/O) circuits, and the like, coupled to the various components of the processing assembly 100 to facilitate control of substrate processing. The controller 190 also includes hardware or software for monitoring substrate processing through sensors in the processing chambers 140, 145, 160 and the transfer chamber 150, including sensors monitoring flow, RF power, electric field and the like. Other sensors that measure system parameters such as substrate temperature, chamber atmosphere pressure and the like, may also provide information to the controller 190.

To facilitate control of the processing assembly 100, the CPU may be one of any form of general purpose computer processor that can be used in an industrial setting, such as a programmable logic controller (PLC), for controlling various chambers and sub-processors. The memory is coupled to the CPU and the memory is non-transitory and may be one or more of readily available memory such as random access memory (RAM), read only memory (ROM), floppy disk drive, hard disk, or any other form of digital storage, local or remote. Support circuits are coupled to the CPU for supporting the processor in a conventional manner. The layer formation, curing, and other processes are generally stored in the memory, typically as a software routine. The software routine may also be stored and/or executed by a second CPU that is remotely located from the hardware being controlled by the CPU.

The memory is in the form of computer-readable storage media that contains instructions, that when executed by the CPU, facilitates the operation of UV curing apparatus 165a-165g. The instructions in the memory are in the form of a program product such as a program that implements the method of the present disclosure. The program code may conform to any one of a number of different programming languages. In one example, the disclosure may be implemented as a program product stored on computer-readable storage media for use with a computer system. The program (s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the UV curing apparatus 165a-165g. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the controller 190 is an etherCAT controller.

Figure 2A:
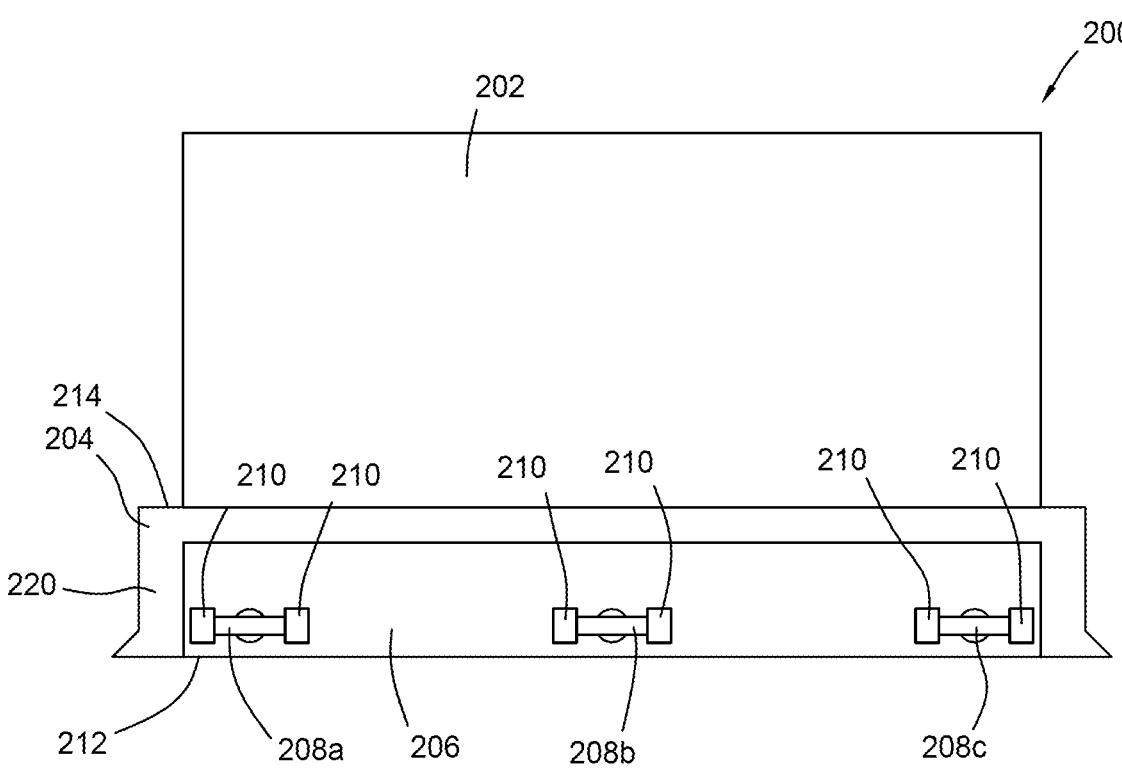
FIG. 2A illustrates a schematic first side view of a curing apparatus for curing a substrate, according to embodiments described herein.

FIG. 2A illustrates a schematic first side view of a curing apparatus 200 for curing a substrate. The curing apparatus 200 includes a casing 204, a UV radiation assembly 202 coupled to the casing 204, and a purge module 205 coupled to the casing 204. The curing apparatus 200 may be utilized in place of any one of the UV curing apparatus 165a-165g of FIG. 1. The curing apparatus 200 is a line curing apparatus and is configured to have a substrate pass across an exposure region of the curing apparatus 200.

The casing 204 is configured to hold each of the UV radiation assembly 202 and the purge module 205. The casing 204 includes a top surface 214 and a bottom surface 212. The UV radiation assembly 202 is disposed partially through a first opening 226 (FIG. 2B) within the top surface 214. A second opening 305 (FIG. 3) is disposed through the bottom surface 212. The top surface 214 and the bottom surface 212 are disposed opposite one another. The bottom surface 212 is configured to face a substrate, such that as a substrate passes beneath the curing apparatus 200, the substrate is cured through the second opening 305 within the bottom surface 212.

The casing 204 further includes a plurality of outer sidewalls, such as a back outer sidewall 220. The back outer sidewall 220 is disposed between the top surface 214 and the bottom surface 212. The back outer sidewall 220 is perpendicular to one or both of the top surface 214 and the bottom surface 212. The upper distal end of the back outer sidewall 220 is connected to the top surface 214 and the lower distal end of the back outer sidewall 220 is connected to the bottom surface 212. The back outer sidewall 220 may be referred to as a first sidewall or a first outer sidewall.

The purge module 205 is disposed at least partially through the back outer sidewall 220. The purge module 205 includes one or more purge gas distributors 208a-208c coupled to a gas distribution body 206. The one or more purge gas distributors 208a-208c may include one purge gas distributor, two purge gas distributors, three purge gas distributors, or greater than three purge gas distributors. The curing apparatus 200 of FIG. 2A includes a plurality of purge gas distributors 208a-208c, such as a first purge gas distributor 208a, a second purge gas distributor 208b, and a third purge gas distributor 208c. The purge gas distributors 208a-208c are spaced along an outer wall of the gas distribution body 206. The multiple purge gas distributors 208a-208c assist in distributing the purge gas, which is introduced into the gas distribution body 206 through the multiple purge gas distributors 208a-208c. In some embodiments, the purge gas distributors 208a-208c act as purge gas connections.

Each of the purge gas distributors 208a-208c may have one or more gas inlets 210. In some examples, each of the purge gas distributors 208a-208c have two gas inlets 210. A gas line is configured to be attached to each of the purge gas distributors 208a-208c via one of the gas inlets 210. Each of the gas inlets 210 may serve as a connection point with a gas line, such that purge gas is introduced into the purge gas distributors 208a-208c via each of the gas inlets 210. The purge gas distributors 208a-208c may be a linear fitting, a T-shaped fitting, a Y-shaped fitting, or an elbow joint fitting. As shown in FIG. 2A, each of the purge gas distributors 208a-208c are the same shape and have the same number of gas inlets 210. However, it is envisioned the purge gas distributors 208a-208c may have different shapes and have different numbers of gas inlets 210.

The gas distribution body 206 is the portion of the purge module 205 disposed through and/or attached to the back outer sidewall 220 of the casing 204. The gas distribution body 206 is configured to receive the gas from each of the purge gas distributors 208a-208c and diffuses the gas into a larger area within the gas distribution body 206 before the gas is introduced into the casing 204.

Figure 2B:
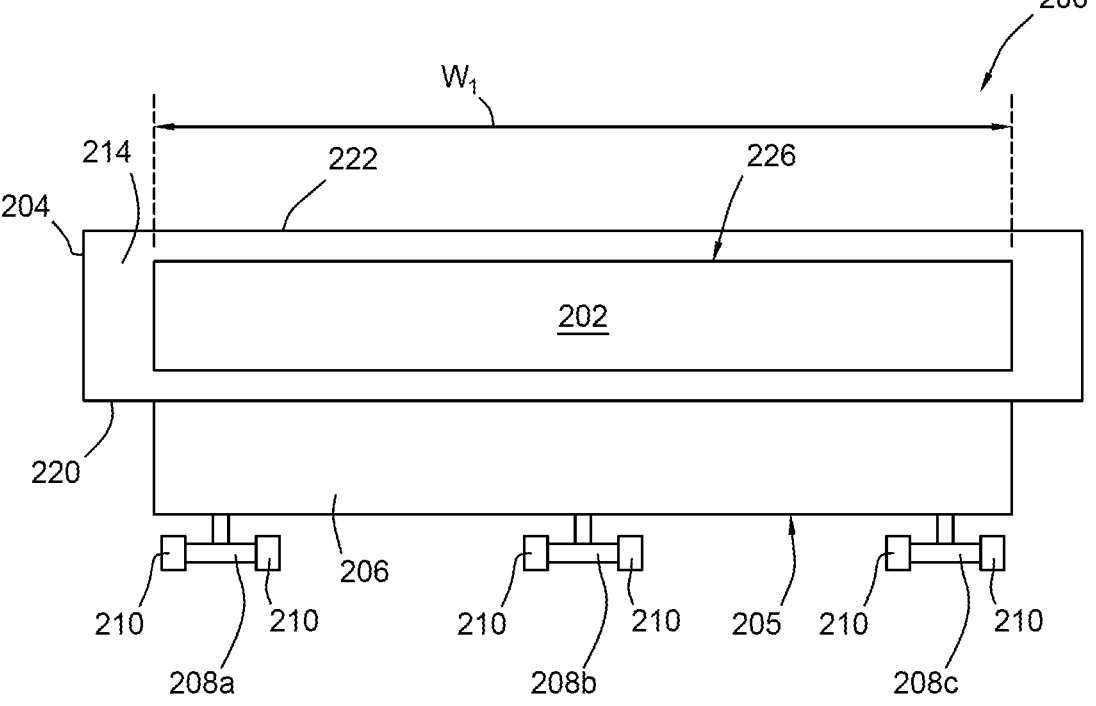
FIG. 2B illustrates a schematic plan view of the curing apparatus of FIG. 2A, according to embodiments described herein.

FIG. 2B illustrates a schematic plan view of the curing apparatus 200. A front outer sidewall 222 of the casing 204 is disposed opposite the back outer sidewall 220. The front outer sidewall 222 is perpendicular to one or both of the top surface 214 and the bottom surface 212. The front outer sidewall 222 may sometimes be referred to as a second sidewall or a second outer sidewall. The upper distal end of the front outer sidewall 222 is connected to the top surface 214 and the lower distal end of the front outer sidewall 222 is connected to the bottom surface 212. The top surface 214 and the bottom surface 212 are disposed between the front outer sidewall 222 and the back outer sidewall 220 of the casing 204. The UV radiation assembly 202 is disposed through the first opening 226 between the front outer sidewall 222 and the back outer sidewall 220. The UV radiation assembly 202 has a first width $W_1$ along a length of the UV radiation assembly 202. The first width $W_1$ is also the length of a line UV radiation source 304 (FIG. 3) of the UV radiation assembly 202. The first width $W_1$ is also the length of a process volume 306 within the casing 204.

The first width $W_1$ is greater than about 100 mm, such as greater than about 150 mm, such as greater than about 200 mm, such as greater than about 250 mm, such as about 250 mm to about 350 mm. The first width $W_1$ is great enough to enable a substrate to be cured by passing beneath the curing apparatus 200. In embodiments wherein a 100 mm substrate is utilized, the first width $W_1$ is greater than about 100 mm, such as about 110 mm to about 150 mm. In embodiments wherein a 200 mm substrate is utilized, the first width $W_1$ is greater than about 200 mm, such as about 210 mm to about 250 mm. In embodiments wherein a 300 mm substrate is utilized, the first width $W_1$ is greater than about 300 mm, such as about 310 mm to about 350 mm. In some embodiments, a multi-pass approaching for curing the substrate is utilized. If a multi-pass approach is utilized, the first width $W_1$ may be smaller than the diameter of the substrate being cured.

Figure 3:
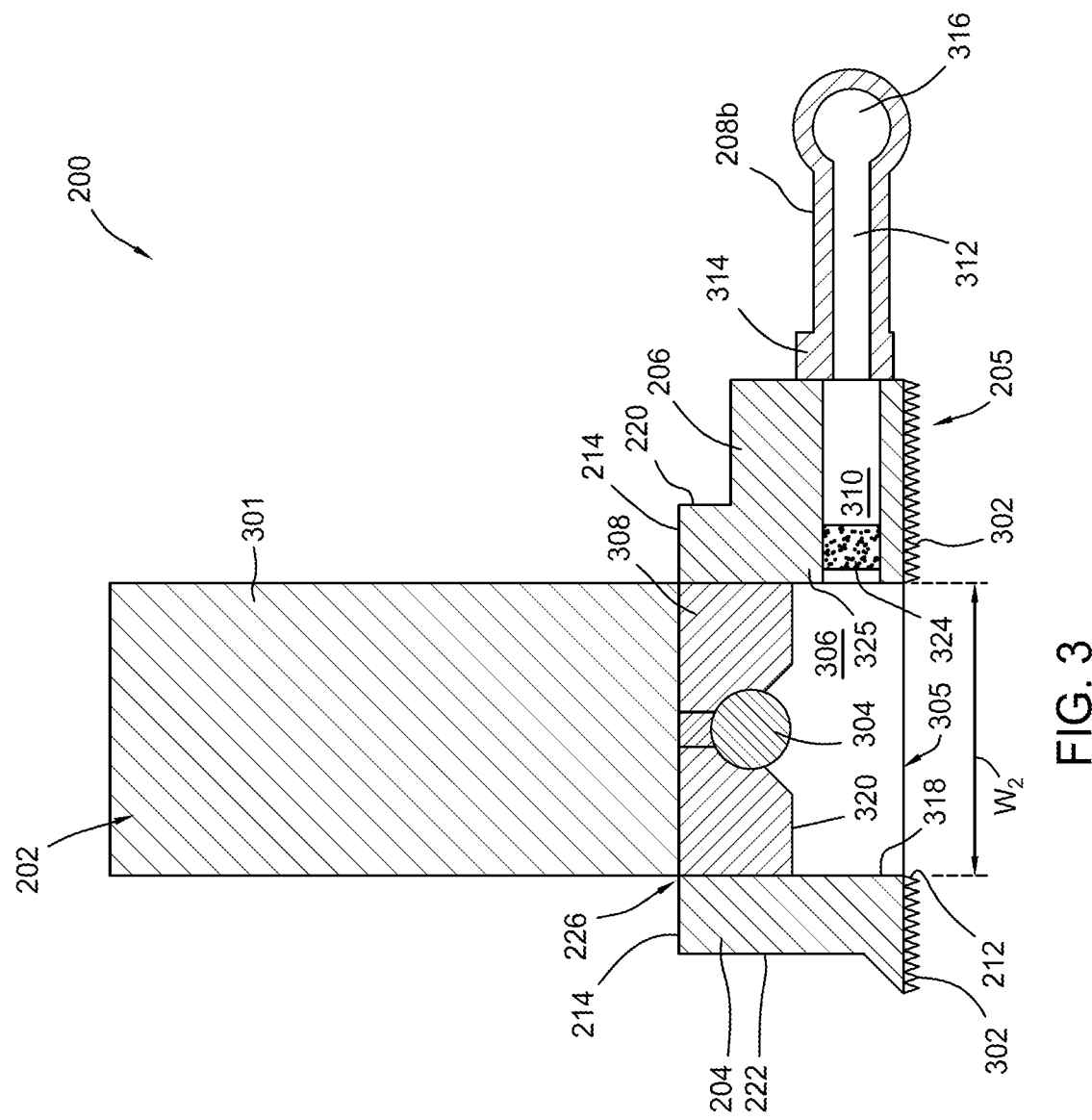
FIG. 3 illustrates a schematic cross-sectional second side view of the curing apparatus of FIGS. 2A and 2B, according to embodiments described herein.

FIG. 3 illustrates a schematic cross-sectional second side view of the curing apparatus 200 of FIGS. 2A and 2B. A process volume 306 is disposed within the casing 204. The process volume 306 is in fluid communication with a line UV radiation source 304, the plurality of purge gas distributors 208a-208c (the second purge gas distributor 208b illustrated), and the second opening 305. The second opening 305 is disposed through the casing 204 opposite the line UV radiation source 304 and the first opening 226.

The UV radiation assembly 202 includes the line UV radiation source 304 as well as one or more radiation guides 320 disposed along the length of the line UV radiation source 304. The body 301 of the UV radiation assembly 202 is disposed above the line UV radiation source 304 and at least partially through the first opening 226. The body 301 may further include one or more cooling channels, one or more power distribution lines, or one or more power modulators.

The one or more radiation guides 320 are portions of the UV radiation assembly 202 which are disposed around the line UV radiation source 304. The one or more radiation guides 320 are configured to direct the radiation emitted by the line UV radiation source 304 towards the second opening 305 and a substrate. The one or more radiation guides 320 may be shaped, such that the radiation guides 320 are disposed around the sides of the line UV radiation source 304 which face the first opening 226, a front inner casing sidewall 318, and a back inner casing sidewall 325. The portion of the line UV radiation source 304 which faces the second opening 305 is therefore the portion of the line UV radiation source 304 which is open to the process volume 306.

The front inner casing sidewall 318 and the back inner casing sidewall 325 are parallel surfaces. The front inner casing sidewall 318 and the back inner casing sidewall 325 form at least a portion of the process volume 306. The front inner casing sidewall 318 and the back inner casing sidewall 325 form part of the second opening 305. The back inner casing sidewall 325 may sometimes be referred to as a first inner sidewall. The front inner casing sidewall 318 may sometimes be referred to as a second inner sidewall.

The line UV radiation source 304 is a radiation source configured to emit radiation in the ultraviolet spectrum. The line UV radiation source 304 may further be configured to emit radiation in other spectrums, such as infrared radiation, light, or microwave radiation. Different radiation types may be utilized in different curing operations. When the line UV radiation source 304 is configured as an ultraviolet emitting radiation source, the line UV radiation source 304 is configured to emit radiation with a wavelength of about 5 nm to about 500 nm, such as about 10 nm to about 400 nm, such as about 200 nm to about 400 nm, such as about 300 nm to about 400 nm. The line UV radiation source 304 is configured to supply a high power density radiation to a substrate as the substrate passes across the second opening 305. The power emitted by the line UV radiation source 304 is greater than about 0.5 $W/m^2$, such as greater than about 1 $W/m^2$, such as about 1.5 $W/m^2$ to about 2 $W/m^2$.

The line UV radiation source 304 may be an elongated UV bulb, an optical fiber, a plurality of optical fibers, or an elongated black body. When an optical fiber or a plurality of optical fibers are utilized, one side of the optical fiber is configured to emit the UV radiation passing therethrough.

The surfaces of the one or more radiation guides 320 and the inner sidewalls of the casing 204 (such as the front inner casing sidewall 318 and the back inner casing sidewall 325) are non-reflective surfaces. Therefore, the one or more radiation guides 320 and the inner sidewalls of the casing 204 have a reflectance of less than about 25% across the UV wavelengths described above, such as less than about 10%, such as less than about 7%. The one or more radiation guides 320 and the inner sidewalls of the casing 204 may therefore include a coating disposed thereon. The coating is configured to reduce the reflectivity of the casing 204 and the components of the UV radiation assembly 202.

The bottom surface 212 of the casing 204 forms a radiation baffle, such that the bottom surface 212 includes a plurality of projections 302 to form a jagged or ridged surface. The plurality of projections 302 are small bumps or ridges formed from the bottom surface 212. Each of the projections 302 have a depth of about 0.2 mm to about 1 mm, such as about 0.3 mm to about 0.8 mm, such as about 0.4 mm to about 0.6 mm, such as about 0.5 mm. The bottom surface 212 has a Ra surface roughness of about Ra $\mu$m to about Ra 20 $\mu$m, such as about 8 $\mu$m to about Ra 15 $\mu$m, such as about 10 $\mu$m to about 13 $\mu$m, such as about 12 $\mu$m to about 13 $\mu$m. The bottom surface 212 and the plurality of projections 302 are non-reflective surfaces. The plurality of projections 302 serve as a baffle and reduce the amount of reflected radiation which scatters across a substrate and outside of the process volume 306. The non-reflective surfaces of each of the bottom surface 212, the one or more radiation guides 320, and the inner sidewalls of the casing 204 further reduce the amount of radiation which is scattered across the substrate and outside of the process volume 306.

The purge module 205 is disposed from the backside of the casing 204. The purge module 205 includes the purge gas distributors 208a-208c and a gas distribution body 206 extending from the back outer sidewall 220. The second purge gas distributor 208b is illustrated in FIG. 3. Each of the first purge gas distributor 208a and the third purge gas distributor 208c are similar to the second purge gas distributor 208b.

The second purge gas distributor 208b includes a gas inlet cavity 316 and a gas flow passage 312 extending from the gas inlet cavity 316 to the gas distribution body 206. The gas inlet cavity 316 is an opening within the second purge gas distributor 208b which is configured to receive a process gas via the one or more gas inlets 210 (FIGS. 2A and 2B). The gas is flowed into the gas inlet cavity 316 and to the gas distribution body 206 via the gas flow passage 312. The gas flow passage 312 is a fluid flow passage disposed within the second purge gas distributor 208b between the gas inlet cavity 316 and a gas distribution passage 310 within the gas distribution body 206. The second purge gas distributor 208b is coupled to the gas distribution body 206 using a coupling 314. The coupling 314 may be a mechanical fastener. In some embodiments, the coupling 314 is a bolt or one or more screws utilized to couple the second purge gas distributor 208b and the gas distribution body 206.

The gas distribution passage 310 is configured to distribute the gas flowed therein from the gas flow passage 312. The gas distribution passage 310 extends along the length of the back inner casing sidewall 325 and the process volume 306. The gas distribution passage 310 is directly coupled to each of the purge gas distributors 208a-208c, such that gas from each of the purge gas distributors 208a-208c is distributed within the same gas distribution passage 310 to form a sheet of purge gas therein. The distribution of the purge gas within the gas distribution passage 310 is further assisted by the use of a diffuser 324 disposed within the gas distribution passage 310. The diffuser 324 is disposed between the gas flow passage 312 and the process volume 306. The gas distribution passage 310 may sometimes be referred to as a purge gas inlet and is a part of the purge gas inlet.

The diffuser 324 is configured to assist in diffusing the purge gas along the length of the back inner casing sidewall 325 before the purge gas enters the process volume 306. The diffuser 324 may be a perforated plate or a perforated mesh. The perforated plate may be a solid plate with a plurality of fluid flow passages disposed along the length of the process volume, such that the perforated plate acts similarly to a showerhead plate. The perforated mesh serves a similar purpose as the perforated plate. The diffuser 324 further catches contaminants and/or particles within the purge gas before the purge gas enters the process volume 306. In some embodiments, the diffuser 324 is formed of a stainless steel or aluminum material, such that the diffuser 324 is a stainless steel or aluminum mesh. The diffuser 324 further increases the backpressure within the gas distribution passage 310 so the inert gas diffuses along the length of the gas distribution passage 310 and the process volume 306. The diffuser 324 has a permeability of about 500 m³/h·m²·kPa to about 1500 m³/h·m²·kPa, such as about 600 m³/h·m²·kPa to about 1200 m³/h·m²·kPa, such as about 700 m³/h·m²·kPa to about 1000 m³/h·m²·kPa, such as about 750 m³/h·m²·kPa to about 850 m³/h·m²·kPa.

The second opening 305 has a length and a width. The length of the second opening 305 is the first width $W_1$ as described above and measures the length along which the second opening 305 extends. The first width $W_1$ therefore spans the length of the second opening 305 in a first direction. The second width $W_2$ is perpendicular to the first width $W_1$, such that the second width $W_2$ extends in a second direction perpendicular to the first direction. The second width $W_2$ is the distance between the front inner casing sidewall 318 and the back inner casing sidewall 325. The second width $W_2$ is less than about 50 mm, such as less than about 35 mm, such as less than about 30 mm, such as less than about 20 mm. The small second width $W_2$ of the second opening 305 enables the scanning of a substrate where only a small portion of the substrate is exposed at one time. Reducing the width of the substrate exposed to the UV source at one time assists in improving curing uniformity by enabling greater control of the radiation exposure of each portion of the substrate. The small second width $W_2$ further assists in reducing the overall volume of the process volume 306. Having a smaller volume of the process volume 306 assists in reducing the amount of purge gas utilized during curing of a substrate. The ratio of the first width $W_1$ to the second width $W_2$ is therefore greater than about 4:1, such as greater than about 5:1, such as greater than about 6:1, such as greater than about 8:1.

Figure 4:
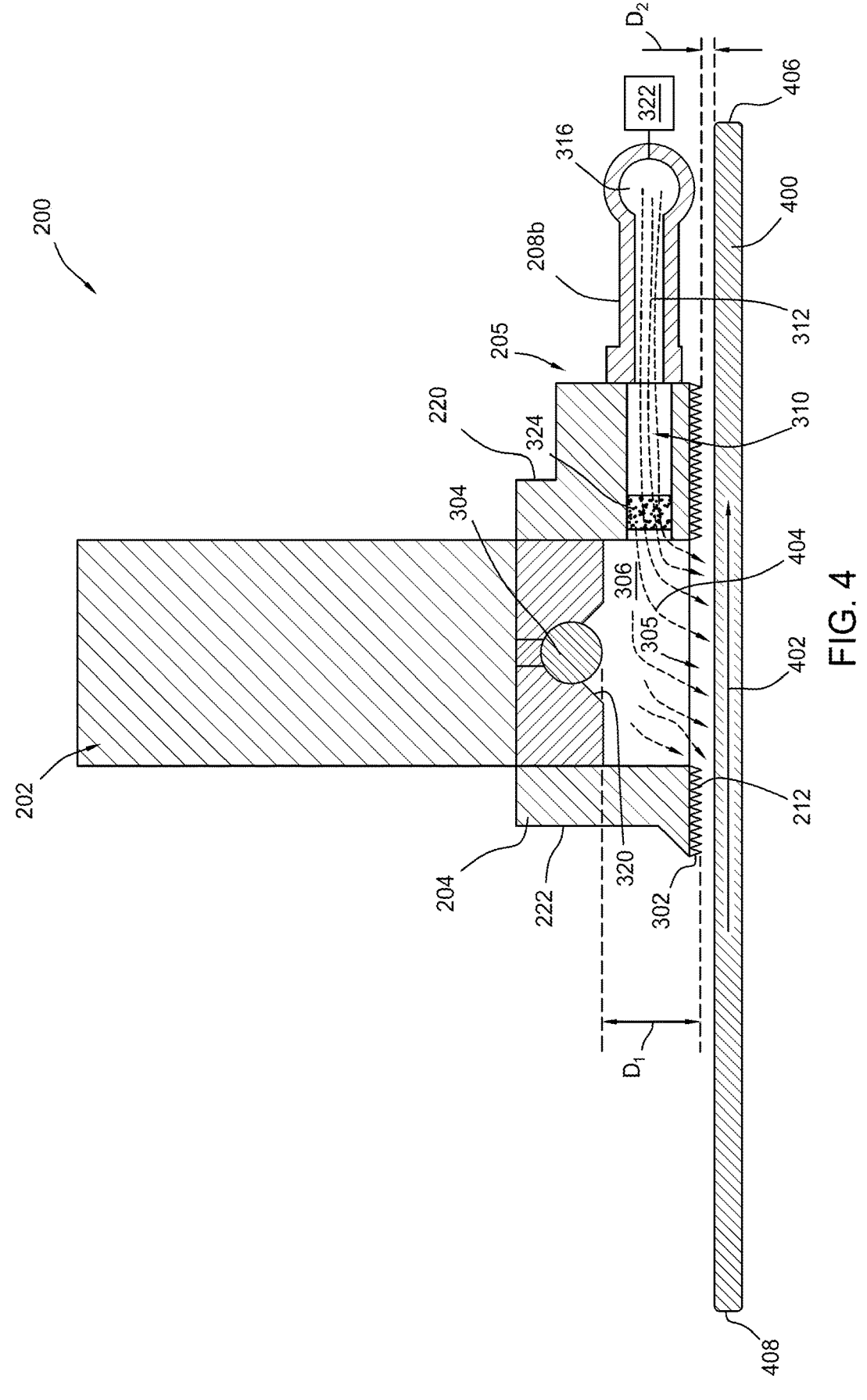
FIG. 4 illustrates a schematic cross-sectional second side view of the curing apparatus of FIG. 3 while curing a substrate, according to embodiments described herein.

FIG. 4 illustrates a schematic cross-sectional second side view of the curing apparatus 200 of FIG. 3 while curing a substrate 400. The substrate 400 is disposed beneath the curing apparatus 200. However, the substrate 400 and the curing apparatus 200 may be oriented in different directions, such that the substrate 400 may alternatively be disposed to the side of or above the curing apparatus 200. The substrate 400 is disposed adjacent to the second opening 305. The substrate 400 is configured to be scanned across the second opening 305, such that the substrate 400 moves in a forward direction 402. The substrate 400 passes beneath the second opening 305, such that a front end 406 of the substrate 400 passes beneath the second opening 305 and then a back end 408 of the substrate 400 passes beneath the second opening 305. Only a portion of the substrate 400 is in line of sight of the line UV radiation source 304 at any one time.

A purge gas flow 404 is flowed through the process volume 306 from the gas distribution passage 310. The purge gas is supplied by a purge gas source 322, which is fluidly coupled to the gas inlet cavities 316 and the gas flow passage 312. The purge gas is flowed from the purge gas source 322, to the gas inlet cavities 316 before flowing into the gas flow passage 312, before flowing into the gas distribution passage 310, before flowing through the diffuser 324 and into the process volume 306. The purge gas is flowed through the process volume 306 and out of the second opening 305 towards the substrate 400 and across the surface of the substrate 400. The purge gas flow 404 is configured to reduce the flow rate of the purge gas across the top surface of the substrate. The purge gas flow rate across the surface of the substrate adjacent to the front inner casing sidewall 318 is further reduced compared to the purge gas flow rate across the surface of the substrate adjacent to the back inner casing sidewall 325. The configuration of the purge module 205 along the back inner casing sidewall 325 assists in reducing the purge gas flow rate across the top surface of the substrate adjacent to the front inner casing sidewall 318. Reduced flow rate adjacent to the front inner casing sidewall 318 is beneficial in that the portion of the substrate adjacent the front inner casing sidewall 318 is not yet cured. As the substrate is cured, the flow rate of the purge gas across the top surface of the substrate may be increased without negatively impacting the substrate.

The distance between the bottom surface 212 of the casing 204 and the line UV radiation source 304 is a first distance $D_1$. The first distance $D_1$ is less than about 15 mm, such as less than about 12 mm, such as about 5 mm to about 12 mm, such as about 7 mm to about 11 mm, such as about 9 mm to about 10 mm. The first distance $D_1$ is further described as a distance between the line UV radiation source 304 and a plane parallel to the bottom surface 212 of the casing 204 and tangent to the bottom surface 212 of the casing 204. The substrate 400 is separated from the bottom surface 212 of the casing 204 by a second distance $D_2$. The second distance $D_2$ is about 0.05 mm to about 3 mm, such as about 0.1 mm to about 1 mm, such as about 0.1 mm to about 0.5 mm. The distance between the substrate 400 and the bottom surface 212 of the casing 204 is small to reduce the purge gas flow utilized. The first distance $D_1$ between the bottom surface 212 of the casing 204 and the line UV radiation source 304 is reduced to reduce the overall power utilized by the line UV radiation source 304 and enable better control of the radiation delivered to the substrate 400. The first distance $D_1$ between the bottom surface 212 of the casing 204 and the line UV radiation source 304 further reduces the overall volume of the process volume 306 and therefore reduces the amount of purge gas utilized during each curing operation.

The curing apparatus 200 described herein therefore provides a more efficient and cost-effective method of curing a substrate. The small process volume 306 enables a reduced purge gas flow. The use of the line UV radiation source 304 and a partial exposure of the substrate enables more uniform UV curing of the substrate. The compact nature of the curing apparatus 200 further enables the curing apparatus 200 to be easily integrated with other portions of the processing assembly 100. Therefore, the curing apparatus 200 may be utilized in place of any one of the UV curing apparatuses 165a-165g.

While the foregoing is directed to embodiments of the present disclosure, other and further embodiments of the disclosure may be devised without departing from the basic scope thereof, and the scope thereof is determined by the claims that follow.

What is claimed is:

1. An apparatus for curing a substrate, suitable for use during semiconductor manufacturing, comprising:
   a casing comprising:
      a top surface;
      a bottom surface opposite the top surface;
      a first sidewall disposed between the top surface and the bottom surface; and
      a second sidewall opposite the first sidewall and disposed between the top surface and the bottom surface, wherein a first opening is disposed through the top surface, a second opening is disposed through the bottom surface, and a process volume is defined between the top surface, the bottom surface, the first sidewall, and the second sidewall;
   an ultraviolet (UV) radiation assembly disposed through the first opening and comprising:
      a line UV radiation source, the line UV radiation source disposed within the process volume between the top surface and the bottom surface; and
      a purge gas inlet disposed through the first sidewall of the casing,
         wherein the second opening has a length extending in a first direction along a length of the line UV radiation source and a width extending in a second direction between the first sidewall and the second sidewall, the second direction perpendicular to the first direction, the length of the second opening greater than about 100 mm, the width less than about 50 mm, and a ratio of the length of the second opening to the width is greater than about 4:1, and
         wherein the second opening is sized to enable scanning of only a line portion of the substrate at a time by the line UV radiation source as the substrate is scanned beneath the line UV radiation source.

2. The apparatus of claim 1, wherein the bottom surface comprises a ridged surface.

3. The apparatus of claim 1, wherein inner sidewalls of the casing have a reflectivity of less than about 25%.

4. The apparatus of claim 1, wherein a distance between the line UV radiation source and a plane tangent to the bottom surface is less than about 15 mm.

5. The apparatus of claim 1, wherein the process volume is defined by the length of the second opening and the width.

6. The apparatus of claim 5, wherein the purge gas inlet has an inlet length of greater than about 100 mm adjacent to the volume.

7. The apparatus of claim 5, wherein a diffuser is disposed within the purge gas inlet.

8. The apparatus of claim 7, wherein the diffuser is one of a perforated plate or a mesh.

9. The apparatus of claim 1, wherein the purge gas inlet comprises a plurality of gas distributors spaced along a width of the casing.

10. An apparatus for curing a substrate, suitable for use during semiconductor manufacturing, comprising:
   a casing forming a volume;

US 12,656,688 B2

13 an ultraviolet (UV) radiation assembly disposed through a first opening through a top surface of the casing and comprising a line UV radiation source, the line UV radiation source disposed within the volume; and a purge gas inlet disposed through a first sidewall of the casing and in fluid communication with the volume, wherein the casing comprises a bottom surface having a second opening, the second opening having a length extending in a first direction along a length of the line UV radiation source and a width extending in a second direction perpendicular to the first direction, the length of the second opening greater than about 100 mm, the width less than about 50 mm, and a ratio of the length of the second opening to the width is greater than about 4:1, and wherein the second opening is sized to enable scanning of only a line portion of the substrate at a time by the line UV radiation source as the substrate is scanned beneath the line UV radiation source.

11. The apparatus of claim 10, wherein the volume has a first width of greater than about 100 mm and the line UV radiation source is disposed along the first width.

12. The apparatus of claim 11, wherein the length of the line UV radiation source is greater than about 100 mm.

13. The apparatus of claim 12, wherein the volume has a second width between the first sidewall and a second sidewall opposite the first sidewall and the second width is less than about 50 mm.

14. The apparatus of claim 10, wherein the line UV radiation source has an output of greater than about 0.5 W/m².

15. The apparatus of claim 10, wherein the bottom surface comprises a ridged non-reflective surface having a roughness (Ra) of about 8 to 15 μm.

16. The apparatus of claim 10, wherein the bottom surface is a ridged surface.

17. The apparatus of claim 10, wherein an inner surface of the casing has a reflectivity of less than about 25%.

18. An apparatus for curing a substrate, suitable for use during semiconductor manufacturing, comprising:

a transfer chamber;

one or more processing chambers coupled to the transfer chamber;

an ultraviolet (UV) curing system comprising:

a casing forming a volume;

a UV radiation assembly disposed through a first opening through a top surface of the casing and comprising a line UV radiation source, the line UV radiation source disposed within the volume; and a purge gas inlet disposed through a first sidewall of the casing and in fluid communication with the volume, wherein the casing comprises a bottom surface having a second opening, the second opening having a length extending in a first direction along a length of the line UV radiation source and a width extending in a second direction perpendicular to the first direction, the length of the second opening greater than about 100 mm, the width less than about 50 mm, and a ratio of the length of the second opening to the width is greater than about 4:1, and wherein the second opening is sized to enable scanning of only a line portion of the substrate at a time by the line UV radiation source as the substrate is scanned beneath the line UV radiation source.

19. The apparatus of claim 18, further comprising a purge gas source fluidly coupled to the purge gas inlet and configured to supply a purge gas to the volume.

20. The apparatus of claim 18, wherein the length of the line UV radiation source is greater than about 100 mm and is configured to cure the substrate as the substrate passes beneath the UV curing system.

* * * * *